(12) United States Patent
Nagatomo et al.

(10) Patent No.: US 12,556,156 B2
(45) Date of Patent: Feb. 17, 2026

(54) ACOUSTIC WAVE DEVICE

(71) Applicant: Murata Manufacturing Co., Ltd., Nagaokakyo (JP)

(72) Inventors: Sho Nagatomo, Nagaokakyo (JP); Minefumi Ouchi, Nagaokakyo (JP); Naohiro Nodake, Nagaokakyo (JP); Tetsuya Kimura, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 393 days.

(21) Appl. No.: 18/121,631

(22) Filed: Mar. 15, 2023

(65) Prior Publication Data
US 2023/0223914 A1    Jul. 13, 2023

Related U.S. Application Data

(63) Continuation of application No. PCT/JP2021/034204, filed on Sep. 16, 2021.
(Continued)

(51) Int. Cl.
*H03H 9/02* (2006.01)
*H03H 9/13* (2006.01)
*H03H 9/17* (2006.01)

(52) U.S. Cl.
CPC .......... *H03H 9/02228* (2013.01); *H03H 9/13* (2013.01); *H03H 9/173* (2013.01); *H03H 9/176* (2013.01)

(58) Field of Classification Search
CPC .. H03H 9/02228; H03H 9/02031; H03H 9/13; H03H 9/173; H03H 9/176; H03H 9/02133; H03H 9/174
(Continued)

(56) References Cited

U.S. PATENT DOCUMENTS

| | | | |
|---|---|---|---|
| 6,437,479 B1 | 8/2002 | Miura et al. | |
| 2005/0237132 A1* | 10/2005 | Sano | H03H 3/02 333/191 |

(Continued)

FOREIGN PATENT DOCUMENTS

| | | | |
|---|---|---|---|
| JP | 2003017980 A | 1/2003 | |
| JP | 2008109414 A | 5/2008 | |

(Continued)

OTHER PUBLICATIONS

S. Yandrapalli, V. Plessky, J. Koskela, V. Yantchev, P. Turner and L. G. Villanueva, Analysis of XBAR Resonance and Higher Order Spurious Modes, IUS, Oct. 6-9, 2019, pp. 185-188. (Year: 2019).*

(Continued)

*Primary Examiner* — Andrea Lindgren Baltzell
*Assistant Examiner* — Victor Cole
(74) *Attorney, Agent, or Firm* — Keating & Bennett, LLP

(57) ABSTRACT

An acoustic wave device includes a support substrate, a piezoelectric layer overlapping the support substrate viewed in a first direction, a functional electrode on at least a first main surface of the piezoelectric layer, and a wiring electrode connected to the functional electrode. A space is provided on a second main surface side opposite to the first main surface of the piezoelectric layer. The space is covered with the piezoelectric layer, the wiring electrode covers a portion of the functional electrode, and an air gap or an insulating film is provided between the functional electrode and the wiring electrode in a region where the functional electrode is covered with the wiring electrode.

20 Claims, 15 Drawing Sheets

Related U.S. Application Data

(60) Provisional application No. 63/079,000, filed on Sep. 16, 2020.

(58) Field of Classification Search
USPC .......... 333/186–188, 193–196; 310/311, 313
See application file for complete search history.

(56) References Cited

U.S. PATENT DOCUMENTS

| | | | |
|---|---|---|---|
| 2008/0143215 A1 | 6/2008 | Hara et al. | |
| 2013/0049888 A1* | 2/2013 | Ruby | H03H 9/172 29/609.1 |
| 2019/0036510 A1 | 1/2019 | Kikuchi et al. | |
| 2019/0386633 A1* | 12/2019 | Plesski | H03H 9/54 |
| 2022/0069803 A1 | 3/2022 | Nozoe | |

FOREIGN PATENT DOCUMENTS

| | | | |
|---|---|---|---|
| JP | 2009232189 A | * | 10/2009 |
| JP | 2012257019 A | | 12/2012 |
| JP | 2013065997 A | | 4/2013 |
| JP | 2020129724 A | | 8/2020 |
| WO | 2017179300 A1 | | 10/2017 |
| WO | 2020130128 A1 | | 6/2020 |

OTHER PUBLICATIONS

International Search Report in PCT/JP2021/034204, mailed Nov. 9, 2021, 4 pages.

Written Opinion in PCT/JP2021/034204, mailed Nov. 9, 2021, 4 pages.

\* cited by examiner

ACOUSTIC WAVE DEVICE

CROSS REFERENCE TO RELATED APPLICATIONS

This application claims the benefit of priority to Provisional Application No. 63/079,000 filed on Sep. 16, 2020 and is a Continuation Application of PCT Application No. PCT/JP2021/034204 filed on Sep. 16, 2021. The entire contents of each application are hereby incorporated herein by reference.

BACKGROUND OF THE INVENTION

1. Field of the Invention

The present disclosure relates to an acoustic wave device including a piezoelectric layer including lithium niobate or lithium tantalate.

2. Description of the Related Art

Japanese Unexamined Patent Application Publication No. 2012-257019 discloses an acoustic wave device.

In the acoustic wave device described in Japanese Unexamined Patent Application Publication No. 2012-257019, there is a possibility that characteristic deterioration such as destruction of the piezoelectric layer or polarization inversion of the piezoelectric layer is likely to occur in a region around a cavity portion where the piezoelectric layer and the edge of the cavity portion overlap each other.

SUMMARY OF THE INVENTION

Preferred embodiments of the present invention provide acoustic wave devices that each reduce or prevent characteristic deterioration of a piezoelectric layer.

An acoustic wave device according to a preferred embodiment of the present invention includes a support substrate, a piezoelectric layer overlapping the support substrate as seen in a first direction, a functional electrode on at least a first main surface of the piezoelectric layer, and a wiring electrode connected to the functional electrode, wherein a space is provided on a second main surface side opposite to the first main surface of the piezoelectric layer, the space is covered with the piezoelectric layer, the wiring electrode covers a portion of the functional electrode, and, as seen in the first direction, an air gap or an insulating film is provided between the functional electrode and the wiring electrode in a region where the functional electrode is covered with the wiring electrode.

According to preferred embodiments of the present disclosure, it is possible to reduce or prevent characteristic deterioration of a piezoelectric layer.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, preferred embodiments of the present disclosure will be described in detail with reference to the drawings. The present disclosure is not limited to the preferred embodiments. Each preferred embodiment described in the present disclosure is an example, in modifications in which partial replacement or combination of configurations is possible between different preferred embodiments, and in the second and subsequent preferred embodiments, description of matters common to the first preferred embodiment will be omitted, and only different points will be described. In particular, the same or similar functions and advantageous effects obtained by the same or similar configurations will not be described in each preferred embodiment.

First Preferred Embodiment

Figure 1A:
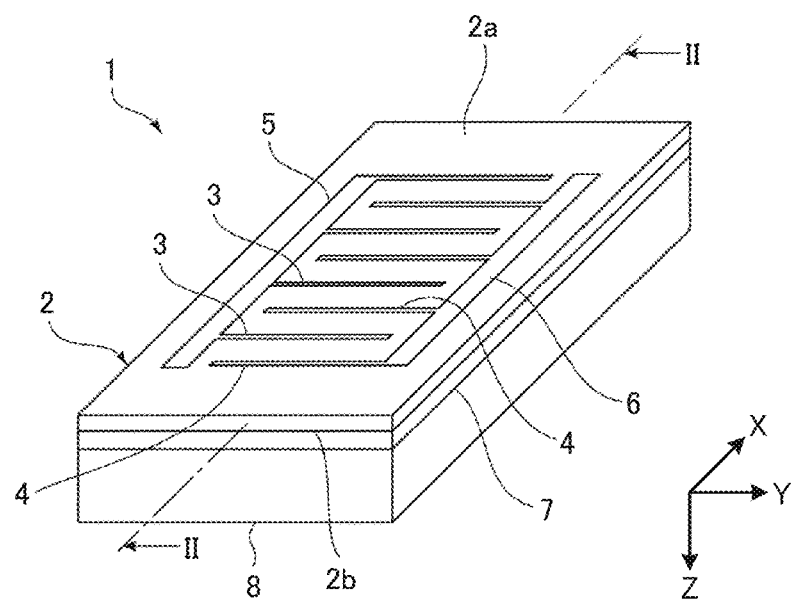
FIG. 1A is a perspective view illustrating an acoustic wave device according to a first preferred embodiment of the present invention.
Figure 1B:
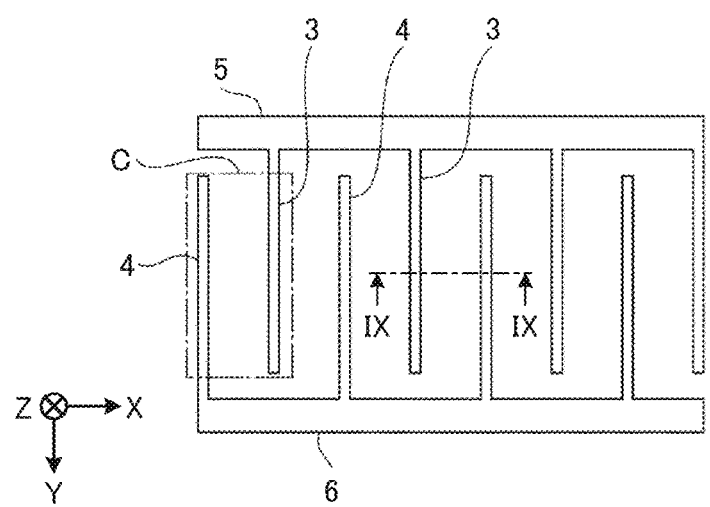
FIG. 1B is a plan view illustrating the structure of electrodes according to the first preferred embodiment of the present invention.

FIG. 1A is a perspective view illustrating an acoustic wave device according to a first preferred embodiment of the present invention. FIG. 1B is a plan view illustrating the structure of electrodes of the first preferred embodiment.

An acoustic wave device 1 of the first preferred embodiment includes a piezoelectric layer 2 made of, for example, LiNbO$_3$. The piezoelectric layer 2 may be made of, for example, LiTaO$_3$. The cut angle of LiNbO$_3$ or LiTaO$_3$ is a Z-cut in the first preferred embodiment. The cut angle of LiNbO$_3$ or LiTaO$_3$ may be a rotated Y-cut or X-cut. The propagation directions of Y propagation and X propagation about ±30° are preferable, for example.

The thickness of the piezoelectric layer 2 is not particularly limited, but is preferably, for example, equal to or more than about 50 nm and equal to or less than about 1000 nm in order to effectively excite the first-order thickness-shear mode as a main wave.

The piezoelectric layer 2 includes a first main surface 2a and a second main surface 2b facing each other in a Z direction. An electrode 3 and an electrode 4 are provided on the first main surface 2a.

Here, the electrode 3 is an example of a "first electrode", and the electrode 4 is an example of a "second electrode". In FIG. 1A and FIG. 1B, a plurality of the electrodes 3 are connected to a first busbar 5. A plurality of the electrodes 4 are connected to a second busbar 6. The plurality of electrodes 3 and the plurality of electrodes 4 are interdigitated with each other.

The electrode 3 and the electrode 4 have a rectangular or substantially rectangular shape and have a length direction. In a direction orthogonal or substantially orthogonal to the length direction, the electrode 3 and the electrode 4 adjacent to the electrode 3 face each other. The length direction of the electrode 3 and the electrode 4 and the direction orthogonal or substantially orthogonal to the length direction of the electrode 3 and the electrode 4 each are a direction intersecting a thickness direction of the piezoelectric layer 2. Therefore, it can also be said that the electrode 3 and the electrode 4 adjacent to the electrode 3 face each other in a direction intersecting the thickness direction of the piezoelectric layer 2. In the first preferred embodiment, the thickness direction of the piezoelectric layer 2 may be referred to as a Z direction (or a first direction), the direction orthogonal or substantially orthogonal to the length direction of the electrode 3 and the electrode 4 may be referred to as an X direction (or a second direction), and the length direction of the electrode 3 and the electrode 4 may be referred to as a Y direction (or a third direction).

Further, the length direction of the electrode 3 and the electrode 4 may be replaced with the direction orthogonal or substantially orthogonal to the length direction of the electrode 3 and the electrode 4 illustrated in FIG. 1A and FIG. 1B. That is, the electrode 3 and the electrode 4 may extend in the direction in which the first busbar 5 and the second busbar 6 extend in FIG. 1A and FIG. 1B. In this case, the first busbar 5 and the second busbar 6 extend in the direction in which the electrode 3 and the electrode 4 extend in FIG. 1A and FIG. 1B. A plurality of pairs of structures in which the electrode 3 connected to one potential and the electrode 4 connected to the other potential are adjacent to each other is provided in a direction orthogonal or substantially orthogonal to the length direction of the above electrodes 3 and 4.

Here, the electrode 3 and the electrode 4 being adjacent to each other refers not to a case where the electrode 3 and the electrode 4 are arranged so as to be in direct contact with each other but to a case where the electrode 3 and the electrode 4 are arranged with an interval therebetween. In addition, when the electrode 3 and the electrode 4 are adjacent to each other, an electrode connected to a hot electrode or a ground electrode, including the other electrodes 3 and 4, is not arranged between the electrode 3 and the electrode 4. The number of pairs need not be integer pairs, but may be, for example, 1.5 pairs, 2.5 pairs, etc.

The center-to-center distance between the electrode 3 and the electrode 4, that is, the pitch is preferably in the range of, for example, equal to or more than about 1 μm and equal to or less than about 10 μm. In addition, the center-to-center distance between the electrode 3 and the electrode 4 is a distance connecting the center of the width dimension of the electrode 3 in the direction orthogonal or substantially orthogonal to the length direction of the electrode 3 and the center of the width dimension of the electrode 4 in the direction orthogonal or substantially orthogonal to the length direction of the electrode 4.

Further, in a case where at least one of the electrode 3 and the electrode 4 defines a plurality of pairs (when the electrode 3 and the electrode 4 defines a pair of electrode sets, there are 1.5 or more pairs of electrode sets), the center-to-center distance between the electrode 3 and the electrode 4 refers to the average value of the center-to-center distances between the respective adjacent electrodes 3 and 4 of the 1.5 or more pairs of electrodes 3 and 4.

In addition, the width of the electrodes 3 and 4, that is, the dimension of the electrodes 3 and 4 in their facing direction, is preferably in the range of, for example, equal to or more than about 150 nm and equal to or less than about 1000 nm. The center-to-center distance between the electrode 3 and the electrode 4 is a distance connecting the center of the dimension (width dimension) of the electrode 3 in the direction orthogonal to the length direction of the electrode 3 and the center of the dimension (width dimension) of the electrode 4 in the direction orthogonal to the length direction of the electrode 4.

In addition, in the first preferred embodiment, since the Z-cut piezoelectric layer is used, the direction orthogonal or substantially orthogonal to the length direction of the electrodes 3 and 4 is a direction orthogonal or substantially orthogonal to the polarization direction of the piezoelectric layer 2. This does not apply when a piezoelectric body of another cut angle is used as the piezoelectric layer 2. Here, "orthogonal" is not limited to strictly orthogonal but may be substantially orthogonal (an angle between a direction orthogonal to the length direction of the electrode 3 and the electrode 4 and the polarization direction is, for example, about 90°±10°).

Figure 2:
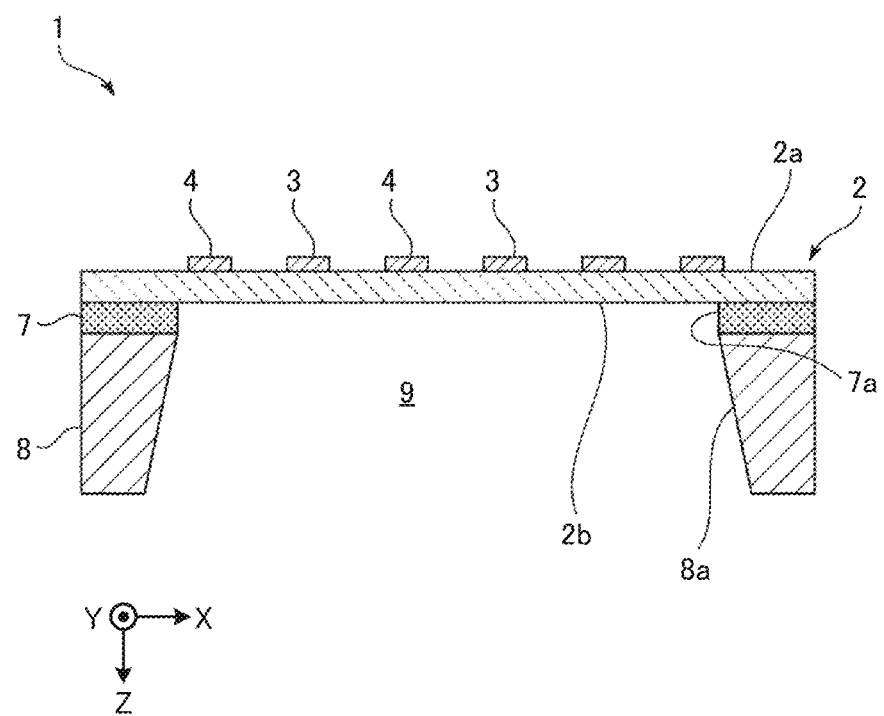
FIG. 2 is a cross-sectional view of a portion taken along line II-II of FIG. 1A.

A support 8 is laminated on the second main surface 2b side of the piezoelectric layer 2 via an intermediate layer 7. The intermediate layer 7 and the support 8 have a frame shape and include opening portions 7a and 8a as illustrated in FIG. 2. Thus, a cavity portion (air gap) 9 is provided.

The cavity portion 9 is provided so as not to interfere with the vibration of an excitation region C of the piezoelectric layer 2. Therefore, the support 8 is laminated on the second main surface 2b via the intermediate layer 7 at a position not overlapping a portion where at least a pair of electrodes 3 and 4 are provided. Note that the intermediate layer 7 need not be provided. Therefore, the support 8 can be directly or indirectly laminated on the second main surface 2b of the piezoelectric layer 2.

The intermediate layer 7 is an insulating layer and is made of, for example, silicon oxide. However, the intermediate layer 7 can be made of an appropriate insulating material such as, for example, silicon oxynitride or alumina in addition to silicon oxide.

The support 8 is also referred to as a support substrate, and is made of, for example, Si. The plane orientation of the surface of Si on the piezoelectric layer 2 side may be (100), (110), or (111). Preferably, high-resistance Si having a resistivity of, for example, equal to or more than about 4 k$\Omega$ is preferable. However, the support 8 can also be made using an appropriate insulating material or semiconductor material. Examples of the material of the support 8 include piezoelectric bodies such as aluminum oxide, lithium tantalate, lithium niobate, and quartz crystal; various ceramics such as alumina, magnesia, sapphire, silicon nitride, aluminum nitride, silicon carbide, zirconia, cordierite, mullite, steatite, and forsterite, dielectrics such as diamond and glass, and semiconductors such as gallium nitride, and the like.

The plurality of electrodes 3 and 4, the first busbar 5, and the second busbar 6 are made of an appropriate metal or alloy such as, for example, Al or an AlCu alloy. In the first preferred embodiment, for example, the electrodes 3 and 4, the first busbar 5, and the second busbar 6 have a structure in which an Al film is laminated on a Ti film. A material other than the Ti film may be used for a close contact layer.

At the time of driving, an AC voltage is applied between the plurality of electrodes 3 and the plurality of electrodes 4. More specifically, an AC voltage is applied between the first busbar 5 and the second busbar 6. As a result, it is possible to obtain a resonance characteristic using a bulk wave in the first-order thickness-shear mode excited in the piezoelectric layer 2.

In addition, in the acoustic wave device 1, d/p is, for example, equal to or less than about 0.5, where d is the thickness of the piezoelectric layer 2, and p is the center-to-center distance between any adjacent electrodes 3 and 4 of the plurality of pairs of electrodes 3 and 4. Therefore, the bulk wave in the first-order thickness-shear mode is effectively excited, and good resonance characteristics can be obtained. More preferably, d/p is, for example, equal to or less than about 0.24, in which case even better resonance characteristics can be obtained.

In a case where at least one of the electrode 3 and the electrode 4 defines a plurality of pairs as in the first preferred embodiment, that is, in a case where, when the electrode 3 and the electrode 4 define a pair of electrode sets, the electrode 3 and the electrode 4 provide 1.5 or more pairs, the center-to-center distance p between the adjacent electrodes 3 and 4 is an average distance of the center-to-center distances between the respective adjacent electrodes 3 and 4.

Since the acoustic wave device 1 of the first preferred embodiment has the above-described configuration, even when the number of pairs of the electrode 3 and the electrode 4 is reduced in an attempt to achieve a reduction in size, Q value is not easily reduced. This is because the resonator does not require reflectors on both sides and has a small propagation loss. In addition, the reason why the above reflector is not required is that the bulk wave in the first-order thickness-shear mode is used.

Figure 3A:
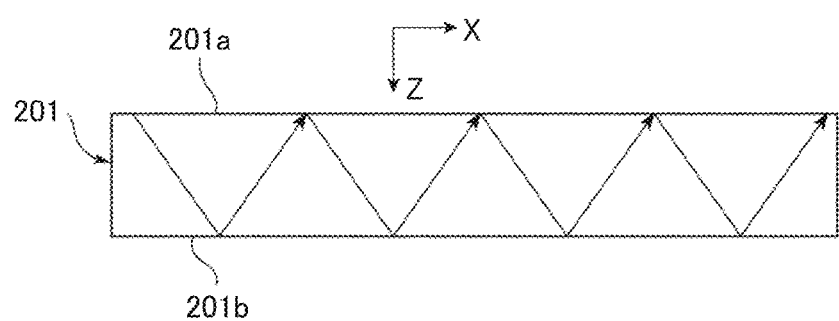
FIG. 3A is a schematic cross-sectional view for explaining a Lamb wave propagating through a piezoelectric layer of a comparative example.
Figure 3B:
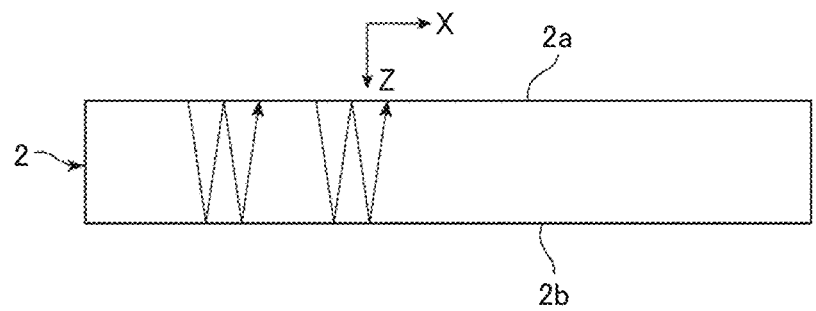
FIG. 3B is a schematic cross-sectional view for explaining a bulk wave in a first-order thickness-shear mode propagating through a piezoelectric layer according to the first preferred embodiment of the present invention.
Figure 4:
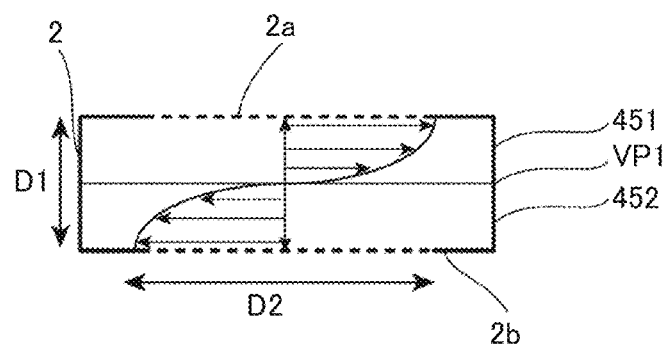
FIG. 4 is a schematic cross-sectional view for explaining an amplitude direction of the bulk wave in the first-order thickness-shear mode propagating through the piezoelectric layer according to the first preferred embodiment of the present invention.

FIG. 3A is a schematic cross-sectional view for explaining a Lamb wave propagating through a piezoelectric layer of a comparative example. FIG. 3B is a schematic cross-sectional view for explaining a bulk wave in the first-order thickness-shear mode propagating through a piezoelectric layer of the first preferred embodiment. FIG. 4 is a schematic cross-sectional view for explaining an amplitude direction of the bulk wave in the first-order thickness-shear mode propagating through the piezoelectric layer of the first preferred embodiment.

In FIG. 3A, an acoustic wave device as described in Japanese Unexamined Patent Application Publication No. 2012-257019 is illustrated, and a Lamb wave propagates through a piezoelectric layer. As illustrated in FIG. 3A, a wave propagates through a piezoelectric layer 201 as indicated by arrows. Here, the piezoelectric layer 201 includes a first main surface 201a and a second main surface 201b, and the thickness direction connecting the first main surface 201a and the second main surface 201b is the Z direction. The X direction is a direction in which electrode fingers of an interdigital transducer (IDT) electrode are arranged. As illustrated in FIG. 3A, the Lamb wave propagates in the X direction. Although the piezoelectric layer 201 vibrates as a whole because of the plate wave, since the wave propagates in the X direction, reflectors are arranged on both sides to obtain resonance characteristics. Therefore, a propagation loss of waves occurs, and the Q value decreases when the size is reduced, that is, when the number of pairs of electrode fingers is reduced.

On the other hand, as illustrated in FIG. 3B, in the acoustic wave device of the first preferred embodiment, since the vibration displacement is in the thickness-shear direction, the wave substantially propagates in the direction connecting the first main surface 2a and the second main surface 2b of the piezoelectric layer 2, i.e., the Z direction, and resonates. That is, the X direction component of the wave is significantly smaller than the Z direction component. Since a resonance characteristic is obtained by the propagation of the wave in the Z direction, a reflector is not required. Therefore, propagation loss does not occur when the wave propagates to the reflector. Therefore, even when the number of pairs of electrodes consisting of the electrode 3 and the electrode 4 is reduced in an attempt to reduce the size, the Q value is not easily reduced.

As illustrated in FIG. 4, the amplitude direction of the bulk wave in the first-order thickness-shear mode in a first region 451 included in the excitation region C (see FIG. 1B) of the piezoelectric layer 2 is the opposite in a second region 452 included in the excitation region C. FIG. 4 schematically illustrates a bulk wave when a voltage is applied between the electrode 3 and the electrode 4 so that the electrode 4 has a higher potential than the electrode 3. The first region 451 is a region between the first main surface 2a and a virtual plane VP1 that is orthogonal to the thickness direction of the piezoelectric layer 2 and divides the piezoelectric layer 2 into two parts in the excitation region C. The second region 452 is a region between the virtual plane VP1 and the second main surface 2b in the excitation region C.

In the acoustic wave device 1, at least a pair of electrodes including the electrode 3 and the electrode 4 are arranged, however, since waves are not propagated in the X direction, the plurality of pairs of electrodes including of the electrode 3 and the electrode 4 is not always necessary. That is, only at least a pair of electrodes may be provided.

For example, the electrode 3 is an electrode connected to the hot potential, and the electrode 4 is an electrode connected to the ground potential. However, the electrode 3 may be connected to the ground potential and the electrode 4 may be connected to the hot potential. In the first preferred embodiment, as described above, at least a pair of electrodes are an electrode connected to the hot potential or an electrode connected to the ground potential, and a floating electrode is not provided.

Figure 5:
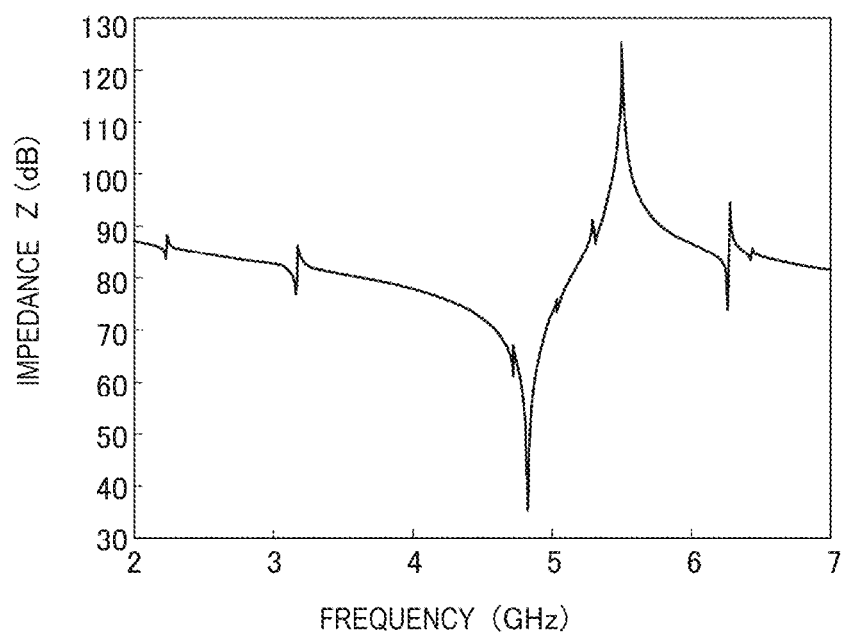
FIG. 5 is an explanatory diagram illustrating an example of resonance characteristics of the acoustic wave device according to the first preferred embodiment of the present invention.

FIG. 5 is an explanatory diagram illustrating an example of resonance characteristics of the acoustic wave device of the first preferred embodiment. The design parameters of the acoustic wave device 1 having the resonance characteristics illustrated in FIG. 5 are as follows.

Piezoelectric layer 2: LiNbO$_3$ with Euler angles (0°, 0°, 90°)
Thickness of piezoelectric layer 2: about 400 nm
Length of excitation region C (see FIG. 1B): about 40 μm
Number of pairs of electrodes consisting of electrode 3 and electrode 4: 21 pairs
Center-to-center distance (pitch) p between electrode 3 and electrode 4: about 3 μm
Width of electrodes 3 and 4: about 500 nm
d/p: about 0.133
Intermediate layer 7: silicon oxide film with thickness of about 1 μm
Support 8: Si The excitation region C (see FIG. 1B) is a region in which the electrode 3 and the electrode 4 overlap as seen in the X direction orthogonal or substantially orthogonal to the length direction of the electrodes 3 and 4. The length of the excitation region C is a dimension of the excitation region C along the length direction of the electrodes 3 and 4.

In the first preferred embodiment, the inter-electrode distances of the electrode pairs including the electrodes 3 and the electrodes 4 were all equal or substantially equal in the plurality of pairs. That is, the electrodes 3 and the electrodes 4 were arranged with equal or substantially equal pitches.

As is apparent from FIG. 5, good resonance characteristics with the fractional bandwidth of, for example, about 12.5% are obtained even though no reflector is provided.

In the first preferred embodiment, d/p is, for example, equal to or less than about 0.5, more preferably equal to or less than about 0.24, where d is the thickness of the above piezoelectric layer 2 and p is the center-to-center distance between the electrode 3 and the electrode 4. This will be described with reference to FIG. 6.

Figure 6:
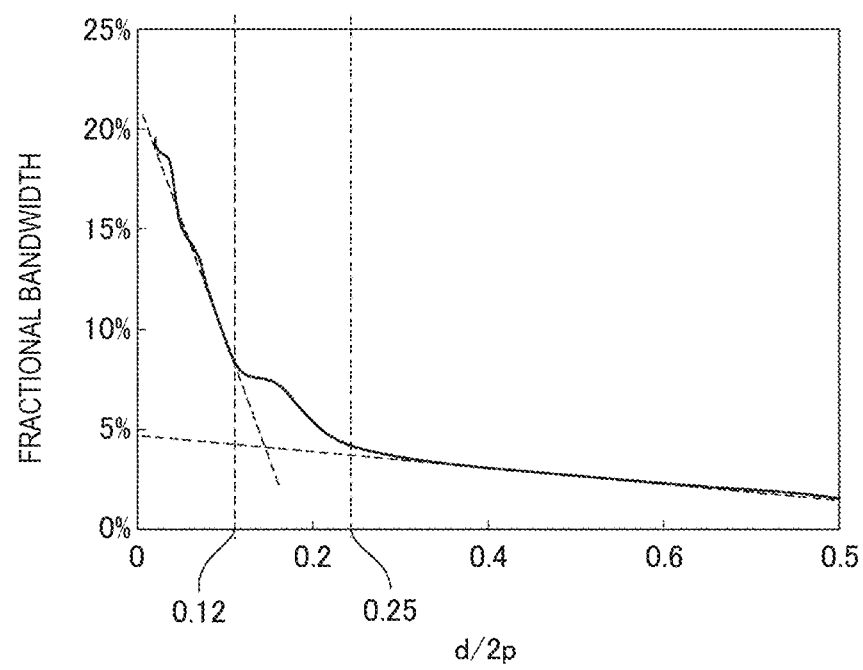
FIG. 6 is an explanatory diagram illustrating the relationship between d/2p and a fractional bandwidth of a resonator in the acoustic wave device according to the first preferred embodiment of the present invention, where p is a center-to-center distance or an average distance of the center-to-center distances between adjacent electrodes, and d is an average thickness of the piezoelectric layer.

A plurality of acoustic wave devices was obtained in the same or substantially the same manner as the acoustic wave device having the resonance characteristics illustrated in FIG. 5, except that d/2p was changed. FIG. 6 is an explanatory diagram illustrating the relationship between d/2p and the fractional bandwidth of the resonator in the acoustic wave device of the first preferred embodiment, where p is the center-to-center distance or the average distance of the center-to-center distances between adjacent electrodes, and d is the average thickness of the piezoelectric layer.

As illustrated in FIG. 6, when d/2p exceeds about 0.25, that is, d/p>about 0.5, the fractional bandwidth is less than about 5% even when d/p is adjusted, for example. On the other hand, when d/2p≤about 0.25, that is, d/p≤about 0.5, for example, the fractional bandwidth can be equal to or more than about 5% by changing d/p within the range, that is, the resonator having a high coupling coefficient can be provided. In addition, when d/2p is equal to or less than about 0.12, that is, d/p is equal to or less than about 0.24, the fractional bandwidth can be increased to equal to or more than about 7%, for example. In addition, when d/p is adjusted within this range, a resonator having a wider fractional bandwidth can be obtained, and a resonator having a higher coupling coefficient can be realized. Therefore, it is understood that by setting d/p to equal to or less than about 0.5, for example, a resonator having a high coupling coefficient using the bulk wave in the above first-order thickness-shear mode can be provided.

The at least one pair of electrodes may be a pair of electrodes, and in the case of one pair of electrodes, p is the center-to-center distance between the adjacent electrodes 3 and 4. Further, in the case of 1.5 or more pairs of electrodes, the average distance of the center-to-center distances between the adjacent electrodes 3 and 4 may be set to p.

For example, when the piezoelectric layer 2 has variations in thickness, a value obtained by averaging the thicknesses may be used.

Figure 7:
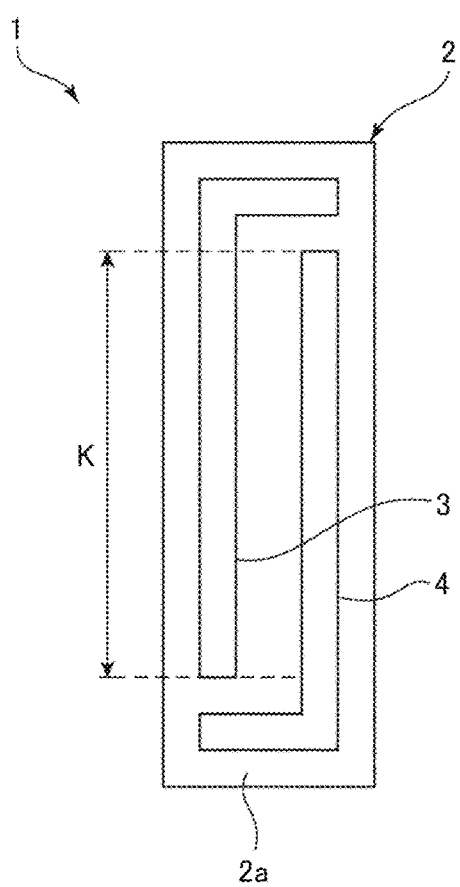
FIG. 7 is a plan view illustrating an example in which a pair of electrodes are provided in the acoustic wave device according to the first preferred embodiment of the present invention.

FIG. 7 is a plan view illustrating an example in which a pair of electrodes are provided in the acoustic wave device of the first preferred embodiment. In the acoustic wave device 1, a pair of electrodes including the electrode 3 and the electrode 4 are provided on the first main surface 2a of the piezoelectric layer 2. K in FIG. 7 is an intersecting width. As described above, in the acoustic wave device of the present preferred embodiment, the number of pairs of electrodes may be one. Also in this case, when d/p is equal to or less than about 0.5, the bulk wave in the first-order thickness-shear mode can be effectively excited.

Figure 8:
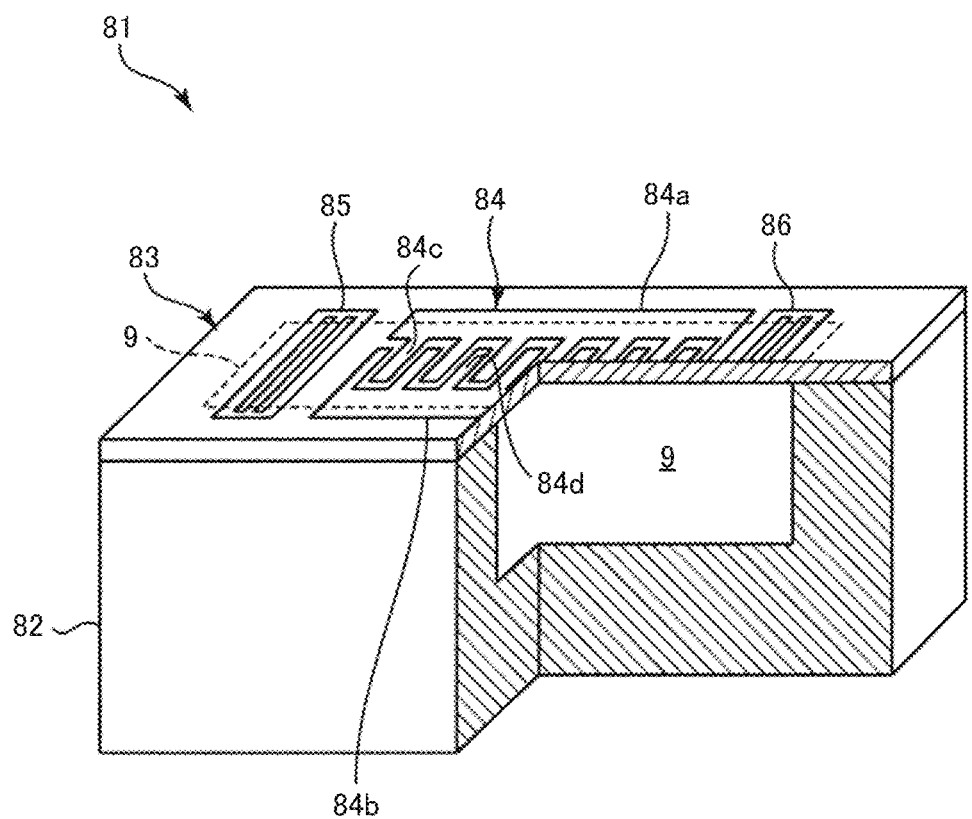
FIG. 8 is a partially cutaway perspective view of an acoustic wave device of a modification of the first preferred embodiment of the present invention.

FIG. 8 is a partially cutaway perspective view of an acoustic wave device of a modification of the first preferred embodiment, in which an acoustic wave device 81 includes a support substrate 82. The support substrate 82 is provided with a concave portion that is open to the upper surface. A piezoelectric layer 83 is laminated on the support substrate 82. Thus, the cavity portion 9 of the support substrate 82 is provided. An IDT electrode 84 is provided on the piezoelectric layer 83 above the cavity portion 9. Reflectors 85 and 86 are provided on both sides of the IDT electrode 84 in the acoustic wave propagation direction. In FIG. 8, the outer peripheral edge of the cavity portion 9 is indicated by a broken line. Here, the IDT electrode 84 includes a first busbar 84a, a second busbar 84b, a plurality of electrodes 84c as first electrode fingers, and a plurality of electrodes 84d as second electrode fingers. The plurality of electrodes 84c are connected to the first busbar 84a. The plurality of electrodes 84d are connected to the second busbar 84b. The plurality of electrodes 84c and the plurality of electrodes 84d are interdigitated.

In the acoustic wave device 81, a Lamb wave as a plate wave is excited by applying an alternating electric field to the IDT electrode 84 on the cavity portion 9. Since the reflectors 85 and 86 are provided on both sides, resonance characteristics due to the above Lamb wave can be obtained.

Figure 9:
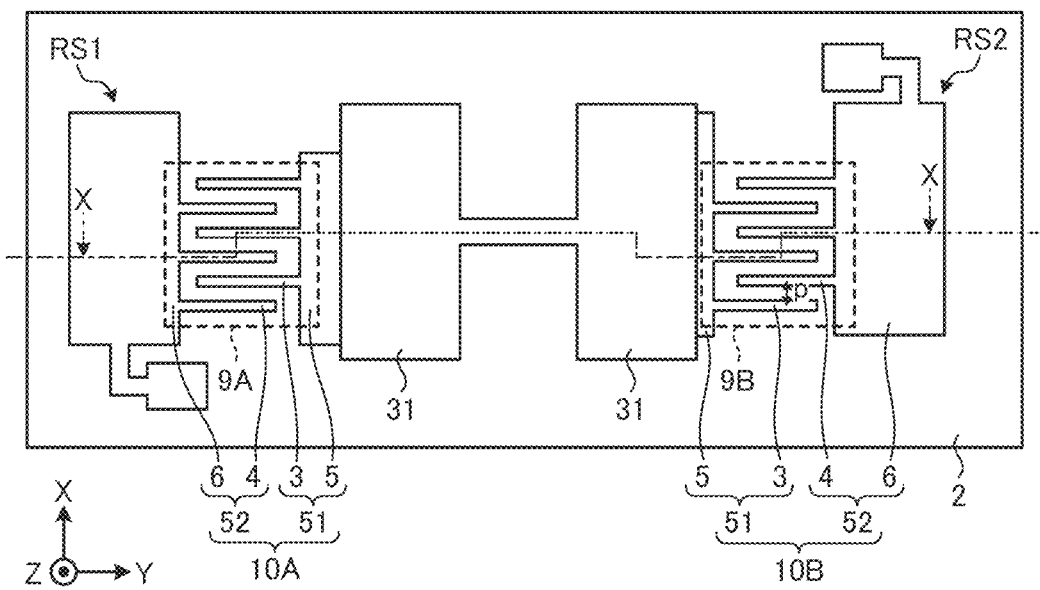
FIG. 9 is a plan view of the acoustic wave device according to the first preferred embodiment of the present invention.
Figure 10:
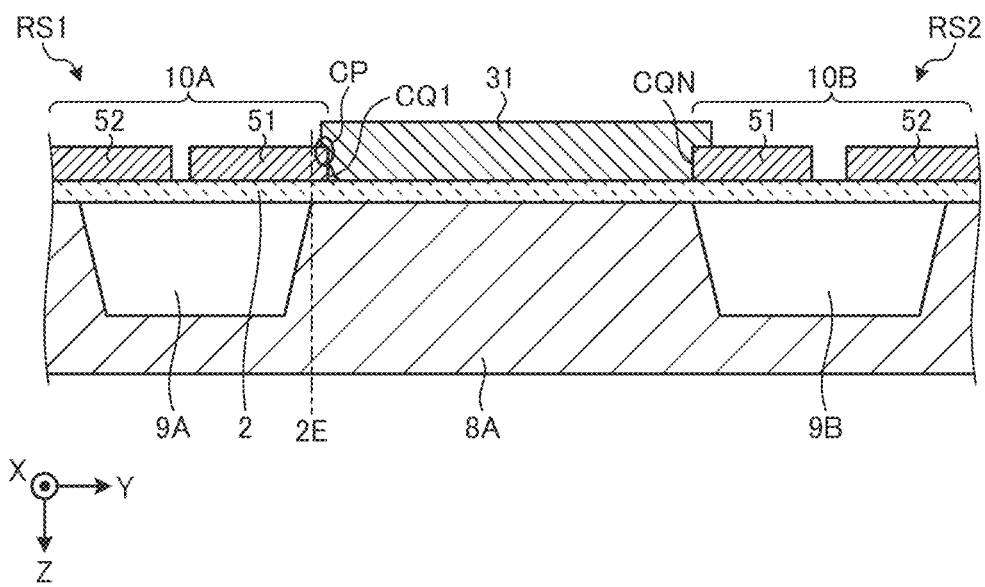
FIG. 10 is a cross-sectional view of a portion taken along line X-X of FIG. 9.

FIG. 9 is a plan view of the acoustic wave device of the first preferred embodiment. FIG. 10 is a cross-sectional view of a portion taken along line X-X of FIG. 9. As illustrated in FIG. 9 and FIG. 10, in the acoustic wave device of the first preferred embodiment, one support 8A supports a first resonator RS1 and a second resonator RS2. The second resonator RS2 is in a different position from the first resonator RS1.

The acoustic wave device illustrated in FIG. 9 and FIG. 10 includes the support 8A and the piezoelectric layer 2 including the first electrode 3 and the second electrode 4 provided on the first main surface 2a and cavity portions 9A and 9B provided on the second main surface 2b side. The cavity portion 9B is provided in the Y direction with respect to the cavity portion 9A. The cavity portion 9A and the cavity portion 9B are spaces provided in a portion of the support 8A. The cavity portion 9A may be referred to as a first space, and the cavity portion 9B may be referred to as a second space.

As illustrated in FIG. 9, a functional electrode 51 includes the plurality of electrodes 3 extending in the Y direction and the first busbar 5 to which the plurality of electrodes 3 is connected. A functional electrode 52 includes the plurality of electrodes 4 extending in the Y direction and the second busbar 6 to which the plurality of electrodes 4 is connected. An IDT electrode 10A of the first resonator RS1 includes the functional electrode 51 and the functional electrode 52. An IDT electrode 10B of the second resonator RS2 includes the functional electrode 51 and the functional electrode 52. The first busbar 5 may also be referred to as a first busbar electrode, and the second busbar 6 may also be referred to as a second busbar electrode.

The functional electrode 51 of the first resonator RS1 and the functional electrode 51 of the second resonator RS2 are electrically connected to each other by a wiring electrode 31. The functional electrode 51 and the functional electrode 52 include at least one of, for example, Al and Cu. The wiring electrode 31 includes at least one of, for example, Al and Cu. Thus, the conductivity of the functional electrode 51, the functional electrode 52, and the wiring electrode 31 can be ensured. More preferably, the wiring electrode 31 includes, for example, at least one of Au and Pt. This makes the wiring electrode 31 more resistant to corrosion.

The wiring electrode 31 covers a portion of the functional electrode 51, and the wiring electrode 31 and the functional electrode 51 are electrically connected to each other at a connection portion CP. In the first preferred embodiment, an air gap CQ1 is provided between the functional electrode 51 of the first resonator RS1 and the wiring electrode 31 in a region where the functional electrode 51 is covered with the wiring electrode 31. The air gap CQ1 is surrounded by the functional electrode 51, the wiring electrode 31, and the piezoelectric layer 2. The air gap CQ1 is not provided between the functional electrode 51 of the second resonator RS2 and the wiring electrode 31, and a close contact portion CQN in which the functional electrode 51 and the wiring electrode 31 are in close contact with each other is provided.

Figure 11:
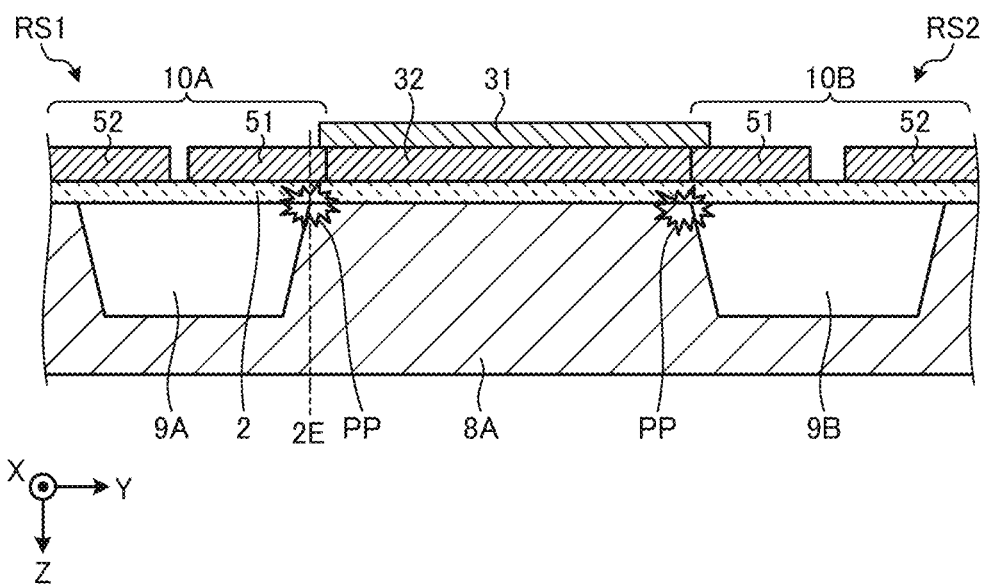
FIG. 11 is a cross-sectional view of an acoustic wave device of a comparative example.

FIG. 11 is a cross-sectional view of an acoustic wave device of a comparative example. FIG. 11 is another example of a cross-sectional view taken along line X-X of FIG. 9. As illustrated in FIG. 11, in the acoustic wave device of the comparative example, a wiring metal layer 32 in the same layer as the functional electrode 51 is between the wiring electrode 31 and the piezoelectric layer 2.

In the acoustic wave device of the comparative example, since the wiring metal layer 32 and the wiring electrode 31 constrain the piezoelectric layer 2, stress concentration due to excitation of the IDT electrode 10A and the IDT electrode 10B is likely to occur in a region PP around the cavity portion where the piezoelectric layer 2 and an edge 2E of the cavity portion 9A overlap. With the stress concentration in the region PP around the cavity portion, characteristic deterioration such as destruction of the piezoelectric layer 2 and polarization inversion of the piezoelectric layer 2 is likely to occur.

On the other hand, in the acoustic wave device of the first preferred embodiment illustrated in FIG. 10, the air gap CQ1 surrounded by the functional electrode 51, the wiring electrode 31, and the piezoelectric layer 2 is provided in the vicinity of the edge 2E of the cavity portion 9A. The air gap CQ1 relaxes the constraint of the piezoelectric layer 2 by the wiring electrode 31. When the constraint of the piezoelectric layer 2 is relaxed, the stress concentration generated in the region PP around the cavity portion where the piezoelectric layer 2 and the edge 2E of the cavity portion 9A overlap is also relaxed. As a result, characteristic deterioration such as destruction of the piezoelectric layer 2 and polarization inversion of the piezoelectric layer 2 is reduced or prevented.

Figure 12:
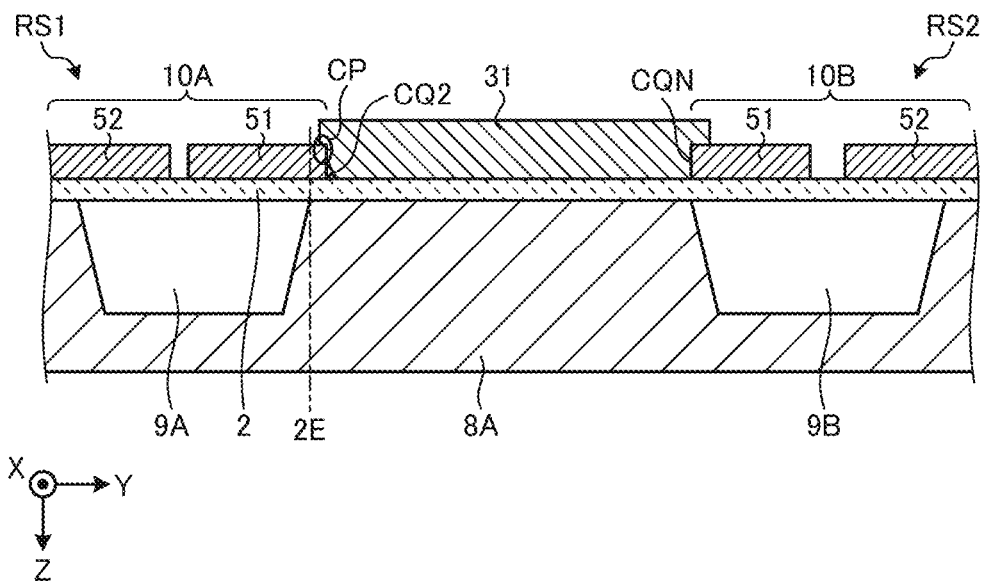
FIG. 12 is a cross-sectional view of an acoustic wave device of a first modification of the first preferred embodiment of the present invention.

FIG. 12 is a cross-sectional view of an acoustic wave device of a first modification of the first preferred embodiment. FIG. 12 is another example of a cross-sectional view taken along line X-X of FIG. 9. As illustrated in FIG. 12, an insulating film CQ2 is interposed inside the air gap between the functional electrode 51 of the first resonator RS1 and the wiring electrode 31. The insulating film CQ2 is any of, for example, silicon oxide, silicon nitride, and resin. The resin is not particularly limited as long as it has insulation properties, and is, for example, polyimide, SiOC, or the like.

In the acoustic wave device of the first modification of the first preferred embodiment illustrated in FIG. 12, the insulating film CQ2 surrounded by the functional electrode 51, the wiring electrode 31, and the piezoelectric layer 2 is provided in the vicinity of the edge 2E of the cavity portion 9A. The insulating film CQ2 relaxes the constraint of the piezoelectric layer 2 by the wiring electrode 31. When the constraint of the piezoelectric layer 2 is relaxed, the stress concentration generated in the region PP around the cavity portion where the piezoelectric layer 2 and the edge 2E of the cavity portion 9A overlap is also relaxed. As a result, characteristic deterioration such as destruction of the piezoelectric layer 2 and polarization inversion of the piezoelectric layer 2 is reduced or prevented.

Figure 13:
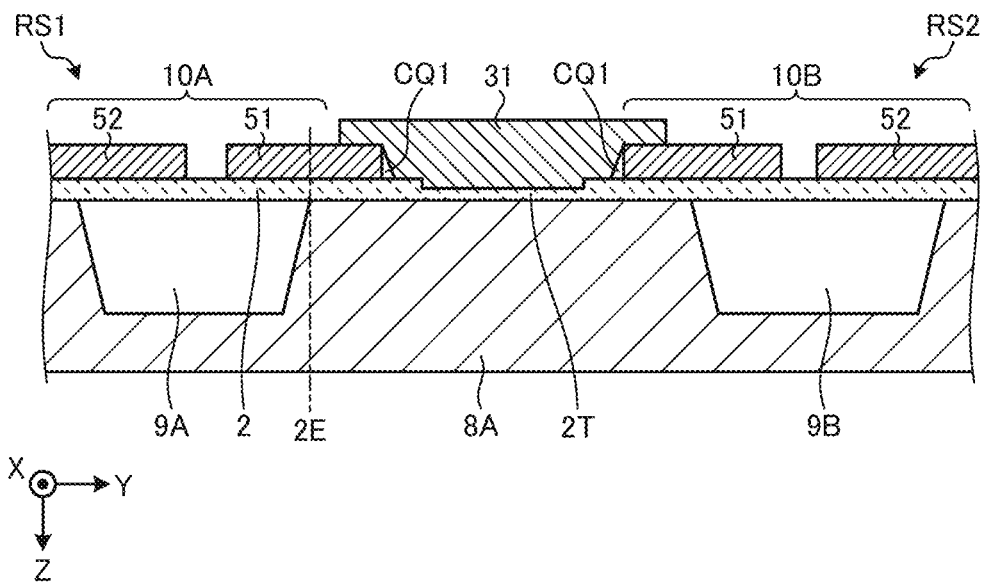
FIG. 13 is a cross-sectional view of an acoustic wave device of a second modification of the first preferred embodiment of the present invention.

FIG. 13 is a cross-sectional view of an acoustic wave device of a second modification of the first preferred embodiment. FIG. 13 is another example of a cross-sectional view taken along line X-X of FIG. 9. In the second modification of the first preferred embodiment, the air gap CQ1 is provided between the functional electrode 51 of the second resonator RS2 and the wiring electrode 31. The two air gaps CQ1 further relax the constraint of the piezoelectric layer 2 by the wiring electrode 31. The air gap CQ1 may be filled with a material of the insulating film.

As illustrated in FIG. 13, a thin portion 2T thinner than the piezoelectric layer 2 in the region overlapping the IDT electrode 10A and the IDT electrode 10B is in a portion of the piezoelectric layer 2. The thickness of the thin portion 2T of the piezoelectric layer 2 in at least a portion between the wiring electrode 31 and the support 8A is smaller than the thickness of the piezoelectric layer 2 between the functional electrode 51 and the support 8A. Thus, the constraint of the piezoelectric layer 2 by the wiring electrode 31 is relaxed.

Figure 14:
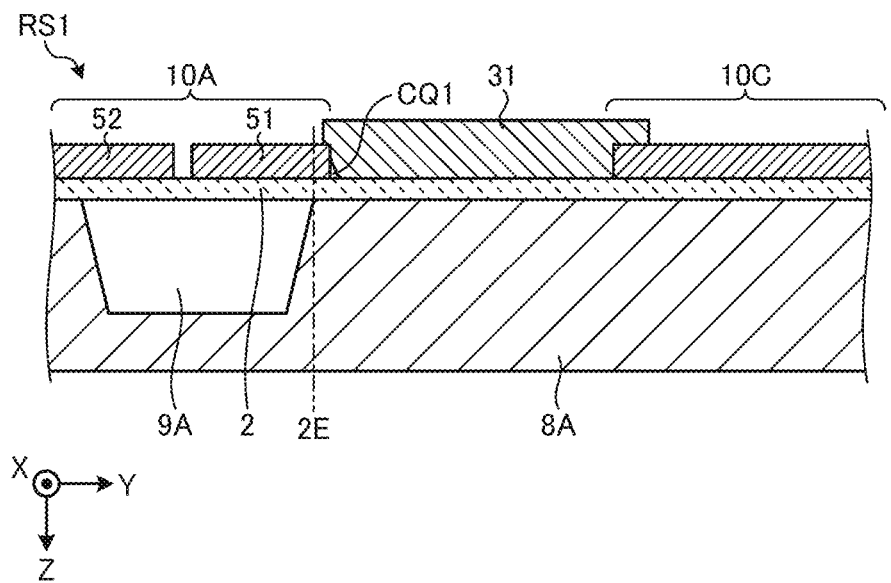
FIG. 14 is a cross-sectional view of an acoustic wave device of a third modification of the first preferred embodiment of the present invention.

FIG. 14 is a cross-sectional view of an acoustic wave device of a third modification of the first preferred embodiment. As illustrated in FIG. 14, another electrode 10C may be provided instead of the second resonator RS2. The other electrode 10C is, for example, any of a signal input terminal, a signal output terminal, and a ground terminal. Also in the third modification of the first preferred embodiment, the air gap CQ1 may be filled with the material of the insulating film.

Figure 15:
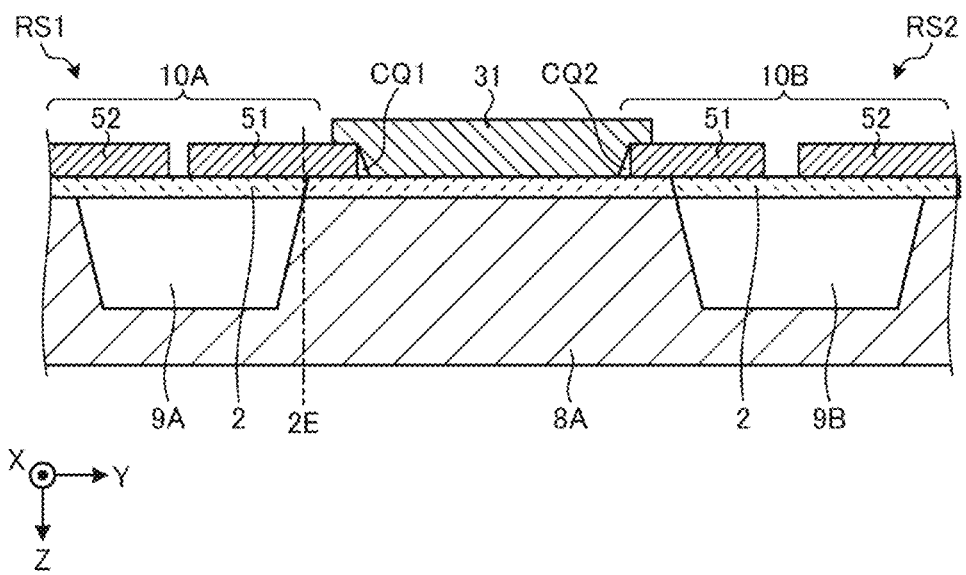
FIG. 15 is a cross-sectional view of an acoustic wave device of a fourth modification of the first preferred embodiment of the present invention.

FIG. 15 is a cross-sectional view of an acoustic wave device of a fourth modification of the first preferred embodiment. The air gap CQ1 is provided between the functional electrode 51 (first functional electrode) of the first resonator RS1 and the wiring electrode 31. The insulating film CQ2 is interposed inside an air gap between the functional electrode 51 (second functional electrode) of the second resonator RS2 and the wiring electrode 31.

Second Preferred Embodiment

Figure 16:
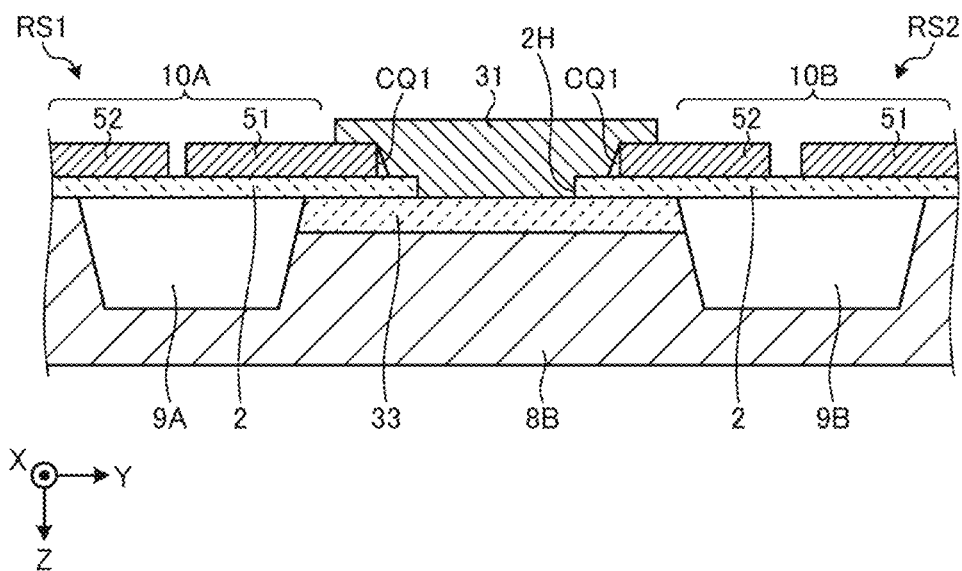
FIG. 16 is a cross-sectional view of an acoustic wave device according to a second preferred embodiment of the present invention.

FIG. 16 is a cross-sectional view of an acoustic wave device according to a second preferred embodiment of the present invention. In the acoustic wave device according to the second preferred embodiment, one support 8B supports the first resonator RS1 and the second resonator RS2. The second resonator RS2 is in a different position from the first resonator RS1. In the second preferred embodiment, the same or corresponding components as those in the first preferred embodiment are denoted by the same reference numerals, and description thereof will be omitted.

As illustrated in FIG. 16, the piezoelectric layer 2 is not provided in at least a portion of the region between the wiring electrode 31 and the support 8B. A slit 2H is provided in a portion of the piezoelectric layer 2. According to this, the constraint of the piezoelectric layer 2 is further relaxed. In the acoustic wave device according to the second preferred embodiment, two functional electrodes 51 and the wiring electrode 31 connected to two functional electrodes are provided on the piezoelectric layer 2. The air gap CQ1 is provided between the wiring electrode 31 and the functional electrode 51. As in the first modification of the first preferred embodiment, an insulating film may be provided inside the air gap CQ1.

In addition, the wiring electrode 31 is defined by a dielectric film 33 on the support 8B. The piezoelectric layer 2 is laminated on the dielectric film 33. According to this, it is possible to avoid the electrical influence of the support 8B which is the support substrate, and it is also possible to relax the stresses generated on the wiring electrode 31 by the dielectric film 33. Examples of the material of the dielectric film 33 include any of silicon oxide, silicon nitride, and resin. The resin is not particularly limited as long as it has insulation properties, and is, for example, polyimide, SiOC, or the like. The wiring electrode 31 may be in direct contact with the support 8B.

Figure 17:
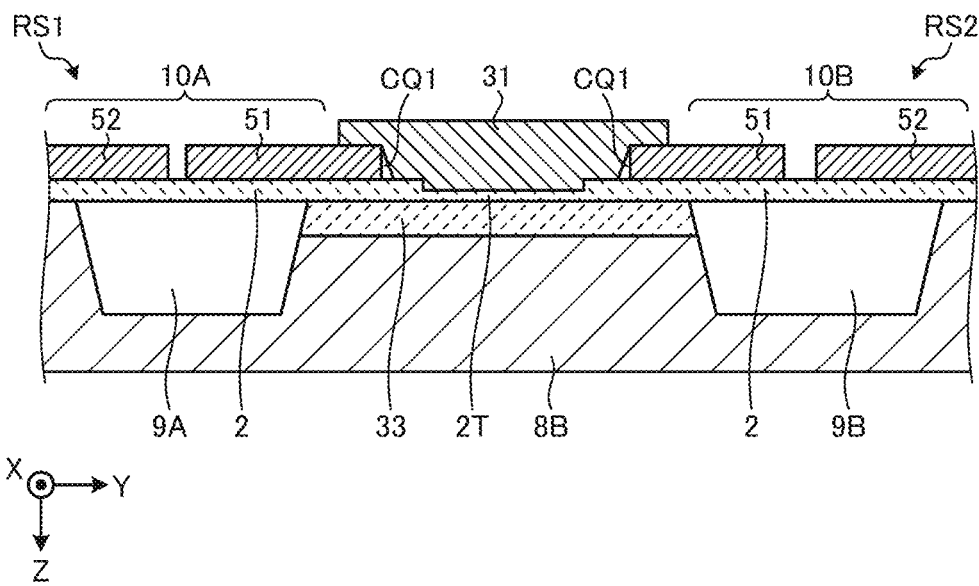
FIG. 17 is a cross-sectional view of an acoustic wave device of a first modification of the second preferred embodiment of the present invention.

FIG. 17 is a cross-sectional view of an acoustic wave device of a first modification of the second preferred embodiment. The dielectric film 33 is laminated on the support 8B, and the piezoelectric layer 2 is provided on the dielectric film 33. The wiring electrode 31 is provided on a portion of the piezoelectric layer 2 and the functional electrode 51. The thickness of the piezoelectric layer 2 in at least a portion between the wiring electrode 31 and the support 8B is smaller than the thickness of the piezoelectric layer 2 between the functional electrode 51 and the support 8B. As in the first modification of the first preferred embodiment, an insulating film may be provided inside the air gap CQ1.

Third Preferred Embodiment

Figure 18:
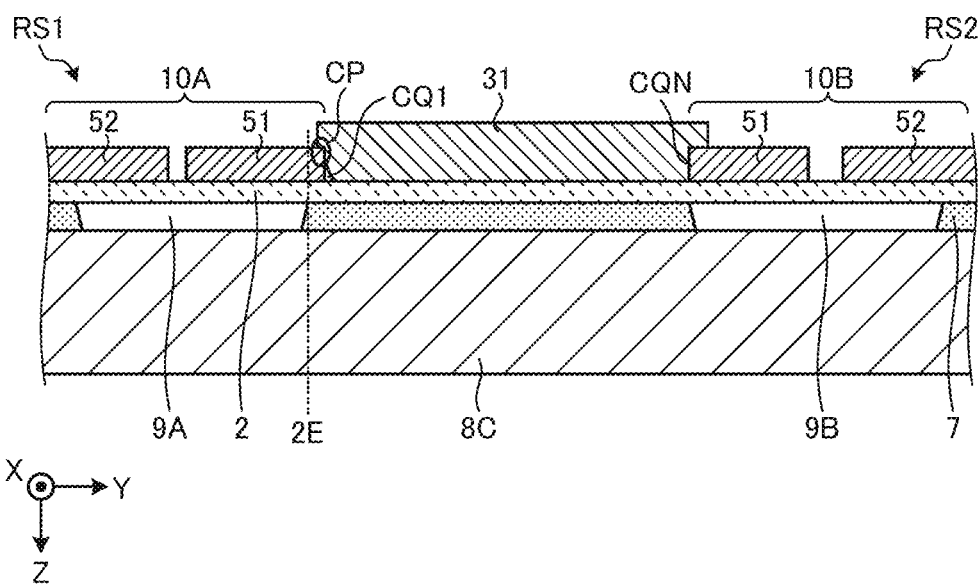
FIG. 18 is a cross-sectional view of an acoustic wave device according to a third preferred embodiment of the present invention.

FIG. 18 is a cross-sectional view of an acoustic wave device according to a third preferred embodiment of the present invention. In the acoustic wave device of the third preferred embodiment, one support 8C supports the first resonator RS1 and the second resonator RS2. The second resonator RS2 is in a different position from the first resonator RS1. In the acoustic wave device of the third preferred embodiment, unlike the acoustic wave device of the first preferred embodiment, the cavity portion 9A and the cavity portion 9B are provided in the intermediate layer 7. In the third preferred embodiment, the same or corresponding components as those of the first preferred embodiment are denoted by the same reference numerals, and description thereof will be omitted.

In the third preferred embodiment, since the cavity portion 9A and the cavity portion 9B are provided in the intermediate layer 7, it is possible to increase the accuracy of the membrane region of the piezoelectric layer 2 overlapping the cavity portion 9A and the cavity portion 9B. The cavity portion 9A and the cavity portion 9B are spaces defined by an air gap provided between the support 8C and the piezoelectric layer 2. In the third preferred embodiment, the piezoelectric layer 2 may be provided with holes to provide the cavity portion 9A and the cavity portion 9B. The piezoelectric layer 2 covers the cavity portion 9A and the cavity portion 9B except for the holes. As described above, at least a portion of the cavity portion 9A and at least a portion of the cavity portion 9B are covered with the piezoelectric layer 2.

Fourth Preferred Embodiment

Figure 19:
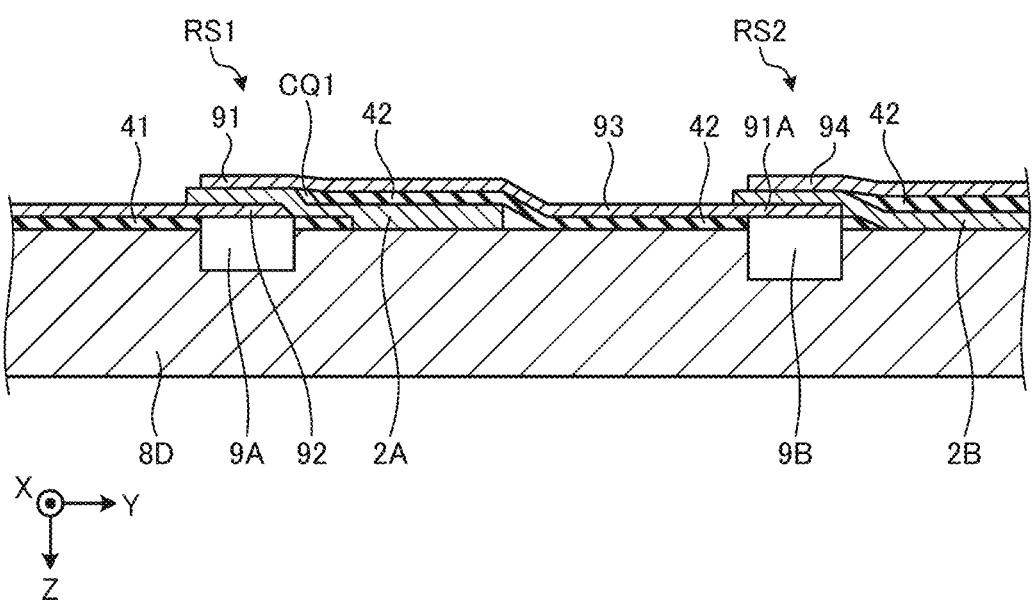
FIG. 19 is a cross-sectional view of an acoustic wave device according to a fourth preferred embodiment of the present invention.

FIG. 19 is a cross-sectional view of an acoustic wave device according to a fourth preferred embodiment of the present invention. In the acoustic wave device according to the fourth preferred embodiment, one support 8D supports the first resonator RS1 and the second resonator RS2. The second resonator RS2 is in a different position from the first resonator RS1. The acoustic wave device according to the fourth preferred embodiment includes an upper electrode 91, a lower electrode 92, and a piezoelectric layer 2A in the first resonator. In the first resonator RS1, the upper electrode 91, and the lower electrode 92 are functional electrodes that face each other and sandwich the piezoelectric layer 2A in the Z direction. The upper electrode 91 is provided on the first main surface of the piezoelectric layer 2A, and the lower electrode 92 is provided on the second main surface of the piezoelectric layer 2A. In the second resonator RS2, a lower electrode 91A and a lower electrode 94 are functional electrodes facing each other and sandwich a piezoelectric layer 2B in the Z direction. The acoustic wave device according to the fourth preferred embodiment may be referred to as a bulk acoustic wave (BAW) element. The electrode 91 and the electrode 91A are electrically connected to each other by a wiring electrode 93.

The cavity portion 9A and the cavity portion 9B provided in the support 8D are covered with the piezoelectric layer 2A and the piezoelectric layer 2B. The electrode 91 and the electrode 92 overlap the cavity portion 9A in the Z direction. The electrode 91A and the electrode 94 overlap the cavity portion 9B in the Z direction.

An insulating film 41 is provided on the support 8D to ensure the insulation property between the electrode 92 and the support 8D. The insulating film 41 may be omitted. An insulating film 42 is provided between the piezoelectric layer 2A and the wiring electrode 93. In addition, the insulating film 42 ensures the insulation property between the wiring electrode 93 and the support 8D. The insulating film 41 and the insulating film 42 are made of the same material as the dielectric film 33 described above. The air gap CQ1 surrounded by the electrode 91, the wiring electrode 93, the insulating film 42, and the piezoelectric layer 2A is provided in the vicinity of an edge of the cavity portion 9A. The air gap CQ1 relaxes the constraint of the piezoelectric layer 2 by the wiring electrode 93. When the constraint of the piezoelectric layer 2A is relaxed, the stress concentration generated in the region around the cavity portion where the piezoelectric layer 2 and the edge of the cavity portion 9A overlap is also relaxed. As a result, characteristic deterioration such as destruction of the piezoelectric layer 2A and polarization inversion of the piezoelectric layer 2A is reduced or prevented.

Fifth Preferred Embodiment

Figure 20:
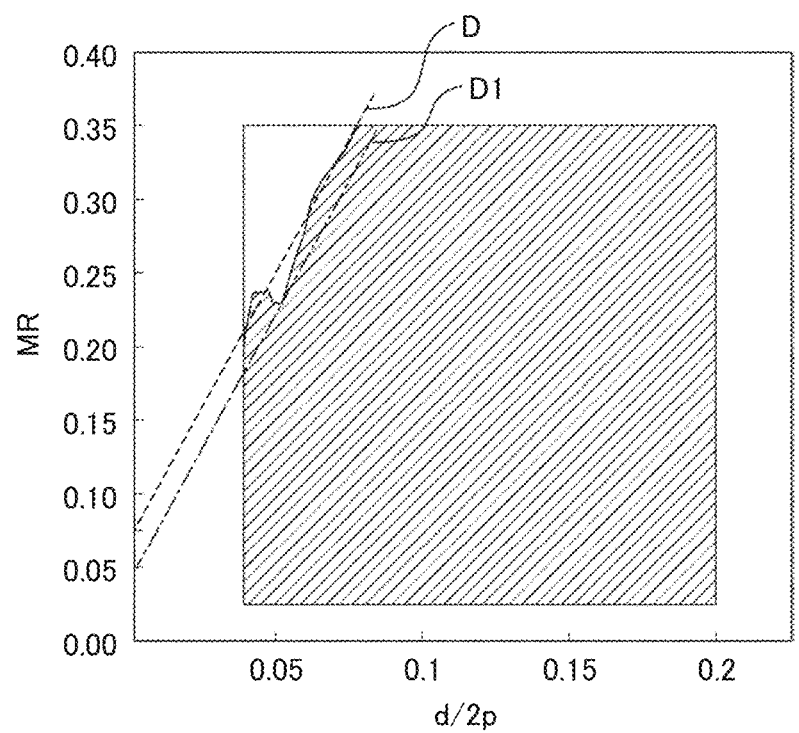
FIG. 20 is an explanatory diagram illustrating a relationship among d/2p, a metallization ratio MR, and a fractional bandwidth in an acoustic wave device according to a fifth preferred embodiment of the present invention.

FIG. 20 is an explanatory diagram illustrating a relationship among d/2p, a metallization ratio MR, and a fractional bandwidth in an acoustic wave device according to a fifth preferred embodiment of the present invention. In the fifth preferred embodiment, the same or corresponding components as those in the first preferred embodiment are denoted by the same reference numerals, and description thereof is omitted. In the acoustic wave device 1 according to the fifth preferred embodiment, various acoustic wave devices 1 having different values of d/2p and different values of MR were provided, and the fractional bandwidth was measured. A hatched portion to the right of a broken line D illustrated in FIG. 20 is a region where the fractional bandwidth is equal to or less than about 17%, for example. The boundary between the hatched region and the non-hatched region is represented by MR=about 3.5 (d/2p)+0.075, for example. That is, MR=about 1.75 (d/p)+0.075, for example. Therefore, MR S about 1.75 (d/p)+0.075 is preferably satisfied, for example. In this case, the fractional bandwidth is easily equal to or less than about 17%, for example. More preferably, it is the region in FIG. 20 to the right of an alternate long and short dash line D1 indicating MR=about 3.5 (d/2p)+0.05, for example. That is, when MR≤about 1.75 (d/p)+0.05, the fractional bandwidth can be reliably set to equal to or less than about 17%, for example.

Sixth Preferred Embodiment

Figure 21:
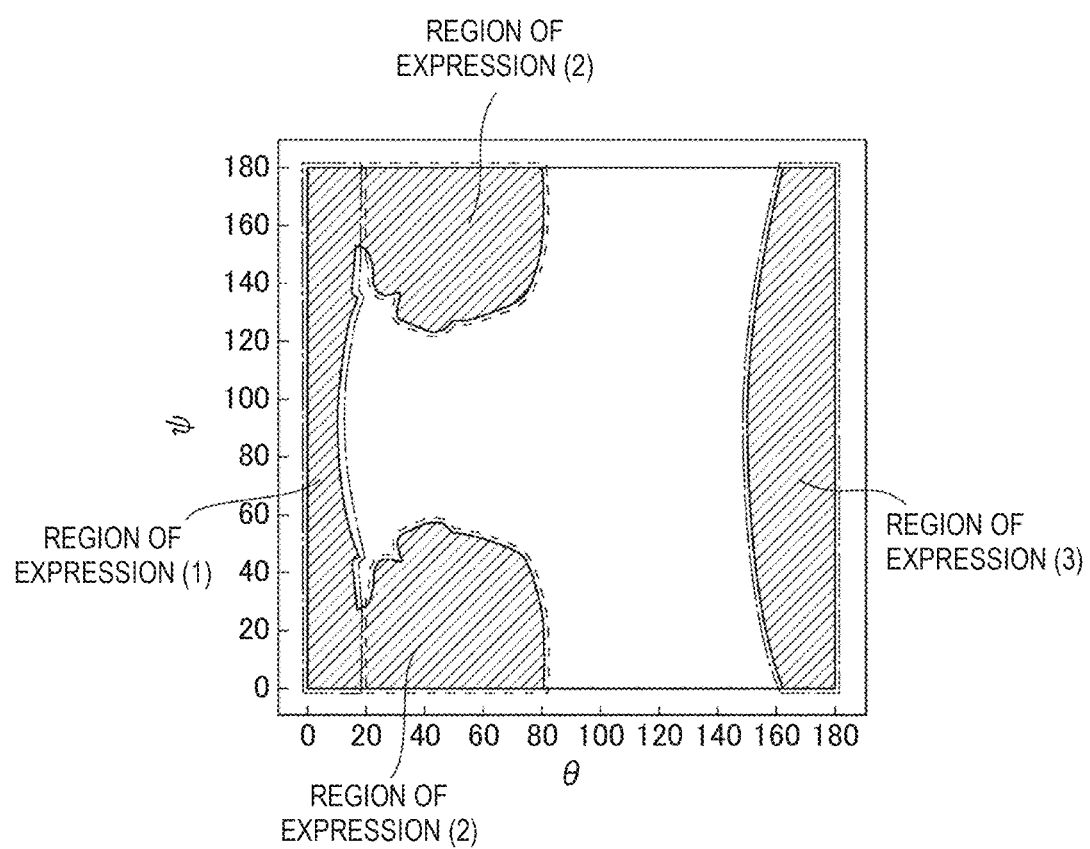
FIG. 21 is an explanatory diagram illustrating a map of the fractional bandwidth with respect to the Euler angles (0°, θ, ψ) of LiNbO$_3$ when d/p is made as close to 0 as possible in an acoustic wave device according to a sixth preferred embodiment of the present invention.

FIG. 21 is an explanatory diagram illustrating a map of the fractional bandwidth with respect to the Euler angles (0°, θ, ψ) of LiNbO$_3$ when d/p is made as close to 0 as possible in an acoustic wave device according to a sixth preferred embodiment of the present invention. In the sixth preferred embodiment, the same or corresponding components as those of the first preferred embodiment are denoted by the same reference numerals, and description thereof will be omitted. A hatched portion illustrated in FIG. 21 is a region where the fractional bandwidth of at least equal to or more than about 5% is obtained, for example. When the range of the region is approximated, the range is expressed by the following Expression (1), Expression (2), and Expression (3).

$$(0°±10°, 0° \text{ to } 20°, \text{arbitrary } \psi) \quad \text{Expression (1)}$$

$$(0°±10°, 20° \text{ to } 80°, 0° \text{ to } 60° (1-(\theta-50)^2/900)^{1/2}) \text{ or } (0°±10°, 20° \text{ to } 80°, [180°-60° (1-(\theta-50)^2/900)^{1/2}] \text{ to } 180°) \quad \text{Expression (2)}$$

$$(0°±10°, [180°-30° (1-(\psi-90)^2/8100)^{1/2}] \text{ to } 180°, \text{arbitrary } \psi) \quad \text{Expression (3)}$$

Therefore, in the case of the Euler angle range of the above Expression (1), Expression (2) or Expression (3), the fractional bandwidth can be sufficiently widened, which is preferable.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device comprising:
   a support substrate;
   a piezoelectric layer overlapping the support substrate in a first direction;
   a functional electrode on at least a first main surface of the piezoelectric layer; and
   a wiring electrode connected to the functional electrode; wherein
   a space is provided on a second main surface side opposite to the first main surface of the piezoelectric layer;
   at least a portion of the space is covered with the piezoelectric layer;
   the wiring electrode covers a portion of the functional electrode only at a position not overlapping the space in the first direction; and
   an air gap or an insulating film is provided between the functional electrode and the wiring electrode in a region not overlapping the space in the first direction and where the functional electrode is covered with the wiring electrode.

2. The acoustic wave device according to claim 1, wherein a connection portion between the functional electrode and the wiring electrode is positioned in a region not overlapping the space in the first direction.

3. The acoustic wave device according to claim 1, wherein the functional electrode includes a plurality of first electrodes, a first busbar electrode connected to the plurality of first electrodes, a plurality of second electrodes, and a second busbar electrode connected to the plurality of second electrodes.

4. The acoustic wave device according to claim 3, wherein a thickness of the piezoelectric layer is equal to or less than about 2p, where p is a center-to-center distance between a first electrode and a second electrode adjacent to each other among the plurality of first electrodes and the plurality of second electrodes.

5. The acoustic wave device according to claim 1, wherein a region where the piezoelectric layer is not provided is located between the wiring electrode and the support substrate.

6. The acoustic wave device according to claim 5, wherein in the region where the piezoelectric layer is not provided, a dielectric film is located between the wiring electrode and the support substrate.

7. The acoustic wave device according to claim 1, wherein a thickness of a piezoelectric layer in at least a portion between the wiring electrode and the support substrate is smaller than a thickness of a piezoelectric layer between the functional electrode and the support substrate.

8. The acoustic wave device according to claim 1, wherein at least one of the functional electrode and the wiring electrode includes at least one of Al and Cu.

9. The acoustic wave device according to claim 1, wherein the wiring electrode includes at least one of Au and Pt.

10. The acoustic wave device according to claim 1, wherein the piezoelectric layer includes lithium niobate or lithium tantalate.

11. The acoustic wave device according to claim 10, wherein the acoustic wave device is operable to generate a bulk wave in a thickness-shear mode.

12. The acoustic wave device according to claim 10, wherein
the functional electrode includes at least a pair of a first electrode and a second electrode facing each other; and
when a thickness of the piezoelectric layer is defined as d, and a center-to-center distance between the first electrode and the second electrode adjacent to each other is defined as p, d/p≤about 0.5 is satisfied.

13. The acoustic wave device according to claim 12, wherein the d/p is equal to or less than about 0.24.

14. The acoustic wave device according to claim 12, wherein, in a direction in which the first electrode and the second electrode face each other, a metallization ratio MR defined by a ratio of an area of the first electrode and the second electrode in an excitation region to the excitation region in which the first electrode and the second electrode overlap each other satisfies MR≤about 1.75 (d/p)+0.075.

15. The acoustic wave device according to claim 1, wherein the functional electrode is an IDT electrode.

16. The acoustic wave device according to claim 1, wherein
a first space and a second space located at a different position from the first space are provided in a portion of the support substrate;
a plurality of the functional electrodes including a first functional electrode overlapping the first space and a second functional electrode overlapping the second space in the first direction, and the wiring electrode connecting the first functional electrode and the second functional electrode are provided; and
a first air gap or a first insulating film is provided between the first functional electrode and the wiring electrode, and a second air gap or a second insulating film is provided between the second functional electrode and the wiring electrode.

17. The acoustic wave device according to claim 1, wherein
the piezoelectric layer includes lithium niobate or lithium tantalate; and
Euler angles (φ, θ, ψ) of the lithium niobate or the lithium tantalate are within a range defined by Expression (1), Expression (2), or Expression (3):

(0°±10°,0° to 20°,arbitrary ψ)　　Expression (1)

(0°±10°,20° to 80°,0° to 60° (1−(θ−50)$^2$/900)$^{1/2}$) or (0°±10°,20° to 80°,[180°−60° (1−(θ−50)$^2$/900)$^{1/2}$] to 180°)　　Expression (2)

(0°±10°,[180°−30° (1−(ψ−90)$^2$/8100)$^{1/2}$] to 180°, arbitrary ψ)　　Expression (3).

18. An acoustic wave device comprising:
a support substrate;
a piezoelectric layer overlapping the support substrate in a first direction;
a functional electrode on at least a first main surface of the piezoelectric layer; and
a wiring electrode connected to the functional electrode; wherein
a space is provided on a second main surface side opposite to the first main surface of the piezoelectric layer;
at least a portion of the space is covered with the piezoelectric layer;
an insulating film is provided between the piezoelectric layer and the wiring electrode; and
an air gap is surrounded by the functional electrode, the wiring electrode, the insulating film, and the piezoelectric layer at or outside an outer edge of the space.

19. The acoustic wave device according to claim 18, further comprising:
a lower electrode on the second main surface of the piezoelectric layer; wherein
the functional electrode includes an upper electrode on the first main surface of the piezoelectric layer; and
the upper electrode and the lower electrode face each other.

20. An acoustic wave device comprising:
a support substrate;
a piezoelectric layer overlapping the support substrate in a first direction;
a functional electrode on at least a first main surface of the piezoelectric layer; and
a wiring electrode connected to the functional electrode; wherein
a space is provided on a second main surface side opposite to the first main surface of the piezoelectric layer;
at least a portion of the space is covered with the piezoelectric layer;
an end of the wiring electrode in a direction orthogonal or substantially orthogonal to the first direction overlaps with the functional electrode only at a position not overlapping the space in the first direction such that the wiring electrode covers a portion of the functional electrode;
an air gap or an insulating film is provided between the functional electrode and the wiring electrode in a region where the functional electrode is covered with the wiring electrode.

* * * * *